US012652893B2

(12) United States Patent
Tee et al.

(10) Patent No.: US 12,652,893 B2
(45) Date of Patent: Jun. 9, 2026

(54) MICRO LIGHT-EMITTING DEVICE AND MICRO LIGHT-EMITTING DEVICE STRUCTURE

(71) Applicant: PlayNitride Display Co., Ltd., MiaoLi County (TW)

(72) Inventors: Boon Khoon Tee, MiaoLi County (TW); You-Lin Peng, MiaoLi County (TW); Chee-Yun Low, MiaoLi County (TW); Wan-Jung Peng, MiaoLi County (TW); Pai-Yang Tsai, MiaoLi County (TW); Fei-Hong Chen, MiaoLi County (TW); Ching-Liang Lin, MiaoLi County (TW)

(73) Assignee: PlayNitride Display Co., Ltd., MaoLi County (TW)

( * ) Notice: Subject to any disclaimer, the term of this patent is extended or adjusted under 35 U.S.C. 154(b) by 379 days.

(21) Appl. No.: 18/353,114

(22) Filed: Jul. 17, 2023

(65) Prior Publication Data

US 2024/0413277 A1      Dec. 12, 2024

(30) Foreign Application Priority Data

Jun. 6, 2023    (TW) .................................. 112120971

(51) Int. Cl.
    *H10H 20/855*      (2025.01)
    *H10H 20/821*      (2025.01)
    *H10H 20/831*      (2025.01)
(52) U.S. Cl.
    CPC ........ *H10H 20/855* (2025.01); *H10H 20/821* (2025.01); *H10H 20/831* (2025.01)
(58) Field of Classification Search
    CPC .. H10H 20/855; H10H 20/821; H10H 20/831; H10H 29/10
    See application file for complete search history.

(56) References Cited

U.S. PATENT DOCUMENTS 11,257,982 B1 *    2/2022    Oyer .................. H10H 20/8162
11,502,223 B1 *    11/2022    Atanackovic ........ H10H 20/822
(Continued)

FOREIGN PATENT DOCUMENTS

| CN | 110010636 | 7/2019 |
| TW | 202213311 | 4/2022 |
| TW | 202228111 | 7/2022 |

OTHER PUBLICATIONS

"Office Action of Taiwan Counterpart Application", issued on Feb. 21, 2024, pp. 1-8.

*Primary Examiner* — Mark W Tornow
(74) *Attorney, Agent, or Firm* — JCIPRNET

(57) ABSTRACT

A micro light-emitting device includes an epitaxial structure, a first electrode, a second electrode, a first contact layer and a diffusion structure. The epitaxial structure includes a first-type semiconductor layer, an active layer and a second-type semiconductor layer stacked in sequence. The second-type semiconductor layer has an outer surface relatively away from the first-type semiconductor layer. The first and second electrodes are respectively disposed on the epitaxial structure and electrically connected to the first-type and the second-type semiconductor layers. The first contact layer is disposed between the first electrode and the first-type semiconductor layer. The diffusion structure is disposed on a side of the second-type semiconductor layer away from the first-type semiconductor layer. A conductivity of the diffusion structure is less than that of the second-type semiconductor layer. The outer surface of the second-type semiconductor layer exposes a lower surface of the diffusion structure away from the first-type semiconductor layer.

13 Claims, 13 Drawing Sheets

(56)                    References Cited

U.S. PATENT DOCUMENTS

| | | | | |
|---|---|---|---|---|
| 2011/0254044 A1* | 10/2011 | Kuo | ....................... | H10H 20/84 |
| | | | | 438/42 |
| 2017/0062683 A1* | 3/2017 | Chen | .................... | H10H 20/835 |
| 2021/0057607 A1* | 2/2021 | Lin | ..................... | H10H 20/8162 |
| 2021/0313499 A1* | 10/2021 | Gasse | ................ | H10H 20/8312 |
| 2022/0077370 A1* | 3/2022 | Zhang | ................. | H10H 20/857 |
| 2022/0271196 A1* | 8/2022 | Herrmann | ............ | H10H 20/821 |

* cited by examiner

MICRO LIGHT-EMITTING DEVICE AND MICRO LIGHT-EMITTING DEVICE STRUCTURE

CROSS-REFERENCE TO RELATED APPLICATION

This application claims the priority benefit of Taiwan application serial no. 112120971 filed on Jun. 6, 2023. The entirety of the above-mentioned patent application is hereby incorporated by reference herein and made a part of this specification.

BACKGROUND

Technical Field

The disclosure relates to a semiconductor device and a semiconductor structure, and in particular relates to a micro light-emitting device and a micro light-emitting device structure.

Description of Related Art

The luminous efficiency of a micro light-emitting diode chip is related to its internal quantum efficiency and external light extraction efficiency, in which the internal quantum efficiency of the micro light-emitting diode chip is related to its epitaxial quality and electrode design. Generally speaking, when the current enters the micro light-emitting diode chip through the contact layer, it passes through the active layer before it diffuses in the horizontal direction, and most of the carriers are recombined right below the connection between the contact layer and the semiconductor layer, resulting in a high local current density and low internal quantum efficiency.

SUMMARY

A micro light-emitting device, which may increase the uniformity of the current density to improve the internal quantum efficiency, is provided in the disclosure.

A micro light-emitting device structure, which includes the micro light-emitting device, and has better display quality, is further provided in the disclosure.

The micro light-emitting device of the disclosure includes an epitaxial structure, a first electrode, a second electrode, a first contact layer, and a diffusion structure. The epitaxial structure includes a first-type semiconductor layer, an active layer and a second-type semiconductor layer stacked in sequence. The second-type semiconductor layer has an outer surface relatively away from the first-type semiconductor layer. The first electrode is disposed on the epitaxial structure and is electrically connected to the first-type semiconductor layer. The second electrode is disposed on the epitaxial structure and is electrically connected to the second-type semiconductor layer. The first contact layer is disposed between the first electrode and the first-type semiconductor layer. The diffusion structure is disposed on a side of the second-type semiconductor layer away from the first-type semiconductor layer. A conductivity of the diffusion structure is less than a conductivity of the second-type semiconductor layer. The outer surface of the second-type semiconductor layer exposes a lower surface of the diffusion structure away from the first-type semiconductor layer.

A micro light-emitting device structure of the disclosure includes a substrate and multiple micro light-emitting devices. The micro light-emitting devices are separately disposed on the substrate. Each of the micro light-emitting devices includes an epitaxial structure, a first electrode, a second electrode, a first contact layer, and a diffusion structure. The epitaxial structure includes a first-type semiconductor layer, an active layer and a second-type semiconductor layer stacked in sequence. The second-type semiconductor layer has an outer surface relatively away from the first-type semiconductor layer. The first electrode is disposed on the epitaxial structure and is electrically connected to the first-type semiconductor layer. The second electrode is disposed on the epitaxial structure and is electrically connected to the second-type semiconductor layer. The first contact layer is disposed between the first electrode and the first-type semiconductor layer. The diffusion structure is disposed on a side of the second-type semiconductor layer away from the first-type semiconductor layer. A conductivity of the diffusion structure is less than a conductivity of the second-type semiconductor layer. The outer surface of the second-type semiconductor layer exposes a lower surface of the diffusion structure away from the first-type semiconductor layer.

Based on the above, in the design of the micro light-emitting device of the disclosure, the diffusion structure is disposed on a side of the second-type semiconductor layer away from the first-type semiconductor layer. The conductivity of the diffusion structure is lower than the conductivity of the second-type semiconductor layer, and the outer surface of the second-type semiconductor layer exposes a lower surface of the diffusion structure away from the first-type semiconductor layer. The design of the diffusion structure may effectively block the direct flow of carriers to the original recombination region, forcing the current to diffuse to a larger range, thereby increasing the uniformity of the current density and improving the internal quantum efficiency.

In order to make the above-mentioned features and advantages of the disclosure comprehensible, embodiments accompanied with drawings are described in detail below.

DETAILED DESCRIPTION OF DISCLOSED EMBODIMENTS

The embodiments of the disclosure may be understood together with the drawings, and the drawings of the disclosure are also regarded as a part of the disclosure. It should be understood that the drawings of the disclosure are not drawn to scale and, in fact, the dimensions of elements may be arbitrarily expanded or reduced in order to clearly represent the features of the disclosure.

Figure 1A:
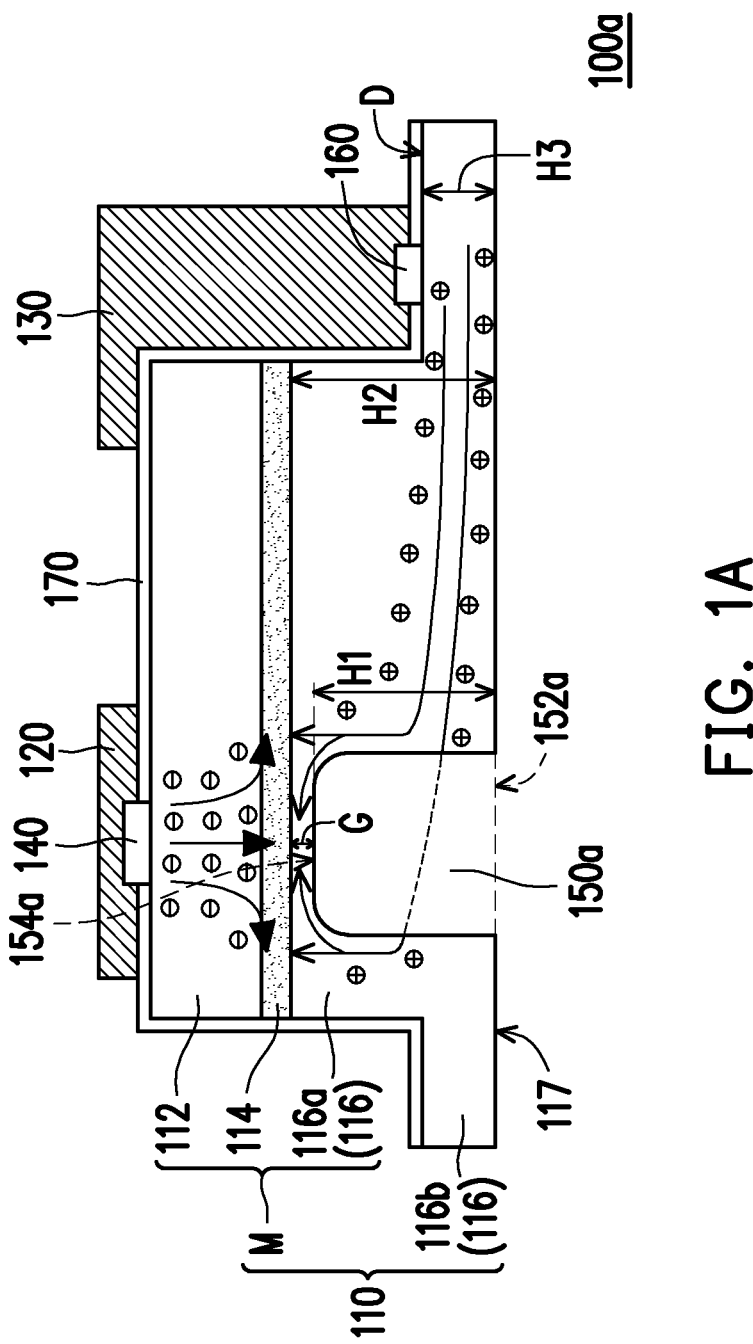
FIG. 1A is a cross-sectional schematic diagram of a micro light-emitting device according to an embodiment of the disclosure.
Figures 1B, 1C:
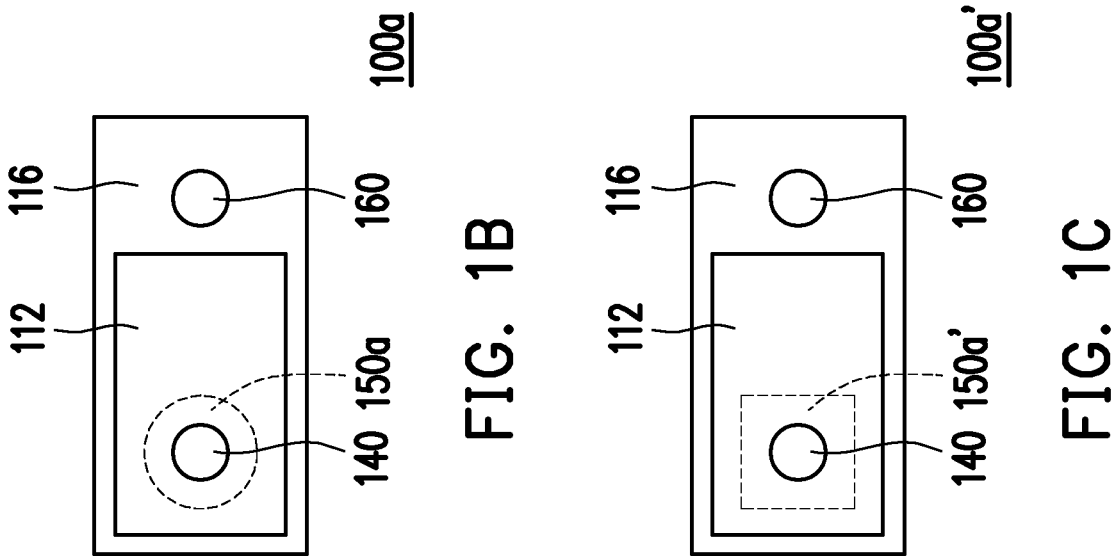
FIG. 1B is a top schematic diagram of the micro light-emitting device in FIG. 1A.
FIG. 1C is a top schematic diagram of a micro light-emitting device according to another embodiment of the disclosure.

FIG. 1A is a cross-sectional schematic diagram of a micro light-emitting device according to an embodiment of the disclosure. FIG. 1B is a top schematic diagram of the micro light-emitting device in FIG. 1A. For convenience of description, some components are omitted in FIG. 1B. Referring to FIG. 1A and FIG. 1B at the same time, in this embodiment, the micro light-emitting device 100a includes an epitaxial structure 110, a first electrode 120, a second electrode 130, a first contact layer 140, and a diffusion structure 150a. The epitaxial structure 110 includes a first-type semiconductor layer 112, an active layer 114, and a second-type semiconductor layer 116 stacked in sequence. The second-type semiconductor layer 116 has an outer surface 117 relatively away from the first-type semiconductor layer 112. The first electrode 120 is disposed on the epitaxial structure 110 and electrically connected to the first-type semiconductor layer 112. The second electrode 130 is disposed on the epitaxial structure 110 and electrically connected to the second-type semiconductor layer 116. The first contact layer 140 is disposed between the first electrode 120 and the first-type semiconductor layer 112. The diffusion structure 150a is disposed on a side of the second-type semiconductor layer 116 away from the first-type semiconductor layer 112. The conductivity of the diffusion structure 150a is less than the conductivity of the second-type semiconductor layer 116. The outer surface 117 of the second-type semiconductor layer 116 exposes the lower surface 152a of the diffusion structure 150a away from the first-type semiconductor layer 112.

In detail, in this embodiment, the micro light-emitting device 100a is, for example, a micro light-emitting diode (micro LED) or a micro chip. As used herein, "micro" devices are meant to have dimensions ranging from 1 micron to 100 microns. In some embodiments, the micro devices may have a maximum width of one of 20 microns, 10 microns, or 5 microns. In some embodiments, the micro devices may have a maximum height of less than one of 20 microns, 10 microns, or 5 microns. It should be understood, however, that the embodiments of the disclosure are not necessarily limited thereto, and aspects of certain embodiments are applicable to larger and possibly smaller scales.

Referring to FIG. 1A again, in the present embodiment, the first-type semiconductor layer 112, the active layer 114, and a first portion 116a of the second-type semiconductor layer 116 form a platform M, and a second portion 116b of the second-type semiconductor layer 116 is recessed relative to the platform M to form a platform surface D. Furthermore, the first electrode 120 and the second electrode 130 in this embodiment are located on the same side of the epitaxial structure 110b, which means that the micro light-emitting device 100a may be a flip-chip type or a lateral type light-emitting diode. Here, one of the first-type semiconductor layer 112 and the second-type semiconductor layer 116 is a P-type semiconductor layer, and the other one of the first-type semiconductor layer 112 and the second-type semiconductor layer 116 is an N-type semiconductor layer. The active layer 114 is a multiple quantum well (MQW) structure layer. In an embodiment not shown, the second electrode 130 passes through the through hole of the first-type semiconductor layer 112 and is electrically connected to the second-type semiconductor layer 114.

Furthermore, the micro light-emitting device 100a of this embodiment further includes an insulating layer 170 covering from the top surface of the platform M to the platform surface D along the side surface. The first contact layer 140 is disposed between the first electrode 120 and the first-type semiconductor layer 112. The first contact layer 140 directly contacts the first-type semiconductor layer 112 to form an ohmic contact, and the first electrode 120 is disposed on the insulating layer 170 and electrically connected to the first-type semiconductor layer 112 through the first contact layer 140. On the other hand, the micro light-emitting device 100a of this embodiment further includes a second contact layer 160 disposed between the second electrode 130 and the second-type semiconductor layer 114 and located on the platform surface D. In an embodiment not shown, the second contact layer of the micro light-emitting device may be disposed between the second electrode and the second-type semiconductor layer, and located in the through hole of the first-type semiconductor layer. The second contact layer 160 directly contacts the second-type semiconductor layer 116 to form an ohmic contact, and the second electrode 130 is disposed on the insulating layer 170 and electrically connected to the second-type semiconductor layer 116 through the second contact layer 160. Here, the materials of the first contact layer 140 and the second contact layer 160 are, for example, gallium arsenide, double-layer metal titanium/aluminum film, indium tin oxide, antimony tin oxide, indium zinc oxide, zinc tin oxide, highly doped P type semiconductor or highly doped N type semiconductor, but not limited thereto.

In addition, referring to FIG. 1A and FIG. 1B at the same time again, the diffusion structure 150a of this embodiment is disposed in the second-type semiconductor layer 116 and located under the first contact layer 140. The orthographic projection of the first contact layer 140 on the active layer 114 overlaps the orthographic projection of the diffusion structure 150a on the active layer 114. Furthermore, the area of the orthographic projection of the diffusion structure 150a on the active layer 114 is greater than the area of the orthographic projection of the first contact layer 140 on the active layer 114. Here, the orthographic projection of the diffusion structure 150a on the active layer 114 completely overlaps the orthographic projection of the first contact layer 140 on the active layer 114. As shown in FIG. 1B, the shape of the orthographic projection of the diffusion structure 150a is, for example, a circle, but not limited thereto.

Since this embodiment is a horizontal micro light-emitting device 100a, under the arrangement of horizontal electrodes, in order to more effectively diffuse the lateral current in the second-type semiconductor layer 116, the lower surface 152a of the diffusion structure 150a needs to extend to the outer surface 117 in the vertical direction (i.e., the epitaxial direction) configuration range. That is, the outer surface 117 of the second-type semiconductor layer 116 exposes the lower surface 152a of the diffusion structure 150a away from of the first-type semiconductor layer 112, so as to prevent the current from directly passing through the region between the lower surface 152a and the outer surface 117 without being diffused by the diffusion structure 150a. In short, through the exposure of the lower surface 152a of the diffusion structure 150a from the outer surface 117 of the second-type semiconductor layer 116, the effect of current diffusion may be effectively improved.

Furthermore, please refer to FIG. 1A again, a first thickness H1 of the diffusion structure 150a in this embodiment is greater than half of a second thickness H2 of the second-type semiconductor layer 116. The second contact layer 160 is disposed in the second-type semiconductor layer 116 at a distance of a third thickness H3 from the lower surface 152a, the first thickness H2 of the diffusion structure 150a is greater than a third thickness H3 of the second portion 116b, so that the diffusion structure 150a may occupy the path from the second contact layer 160 to the first contact layer 140, and the carrier flows horizontally, so as to achieve the effect of current diffusion. There is a gap G between an upper surface 154a of the diffusion structure 150a opposite to the lower surface 152a and the active layer 114, which means that the diffusion structure 150a does not directly contact the active layer 114. If the diffusion structure 150a directly contacts the active layer 114, the carrier cannot pass through the area of the active layer 114 contacted by the diffusion structure 150a, and the recombination area becomes smaller instead. In addition, since the upper surface 154a of the diffusion structure 150a in this embodiment is higher than the second contact layer 160, and there is a gap G between the active layer 114 and the upper surface 154a of the diffusion structure 150a, the effect of diffusing the lateral current may be achieved in the path between the first contact layer 140 and the second contact layer 160.

Preferably, the material of the diffusion structure 150a in this embodiment is, for example, a material with low electrical conductivity, such as an inorganic material, an organic material, or a combination of the above materials. Inorganic materials may be oxides or nitrides, such as silicon dioxide or aluminum nitride. The organic material may be a polymer material, such as resin. Since the diffusion structure 150a in the second-type semiconductor layer 116 adopts low-conductivity material, the instability of the upper stress of the epitaxial structure 110 may be reduced. In one embodiment, when the material of the diffusion structure 150a is air, that is, a cavity, and the air inside is forms an insulating effect, which may avoid changes in conductivity caused by ion diffusion.

It is worth mentioning that the carriers shown in the diagrams of this embodiment, that is, positive electron holes and negative electrons, are for illustrative purposes only. The electrical properties and current directions of the first electrode 120 and the second electrode 130 may also be reversed or arranged oppositely.

It must be noted here that the following embodiments use the component numbers and part of the content of the previous embodiments, in which the same numbers are used to denote the same or similar components, and descriptions of the same technical content are omitted. For the description of the omitted part, reference may be made to the above embodiments, and details are not described in the following embodiments.

FIG. 1C is a top schematic diagram of a micro light-emitting device according to another embodiment of the disclosure. For convenience of illustration, some components are omitted in FIG. 1C. Referring to FIG. 1B and FIG. 1C at the same time, the micro light-emitting device 100a' of this embodiment is similar to the micro light-emitting device 100a, the difference between the two lies in: in this embodiment, the shape of the orthographic projection of the diffusion structure 150a' of the micro light-emitting device 100a' is, for example, a rectangle, specifically a square.

Figure 2A:
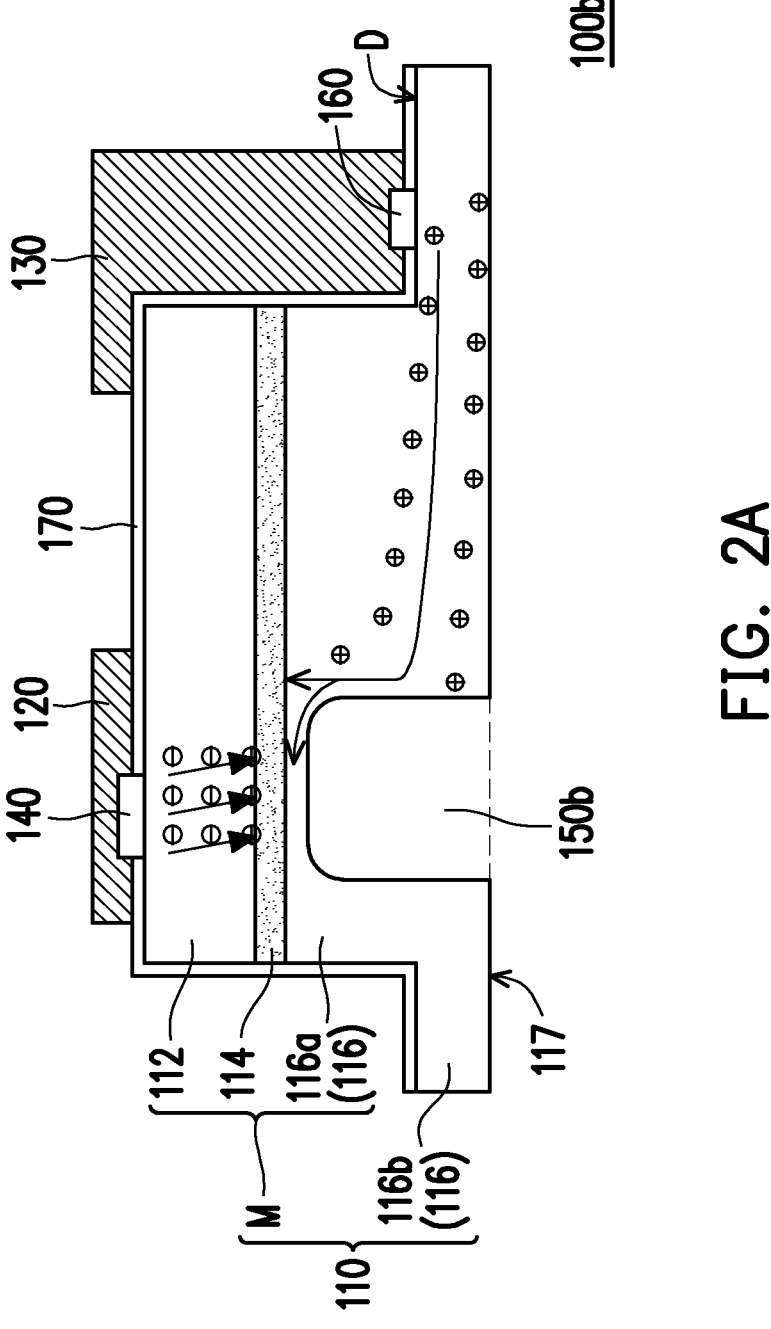
FIG. 2A is a cross-sectional schematic diagram of a micro light-emitting device according to another embodiment of the disclosure.
Figures 2B, 2C:
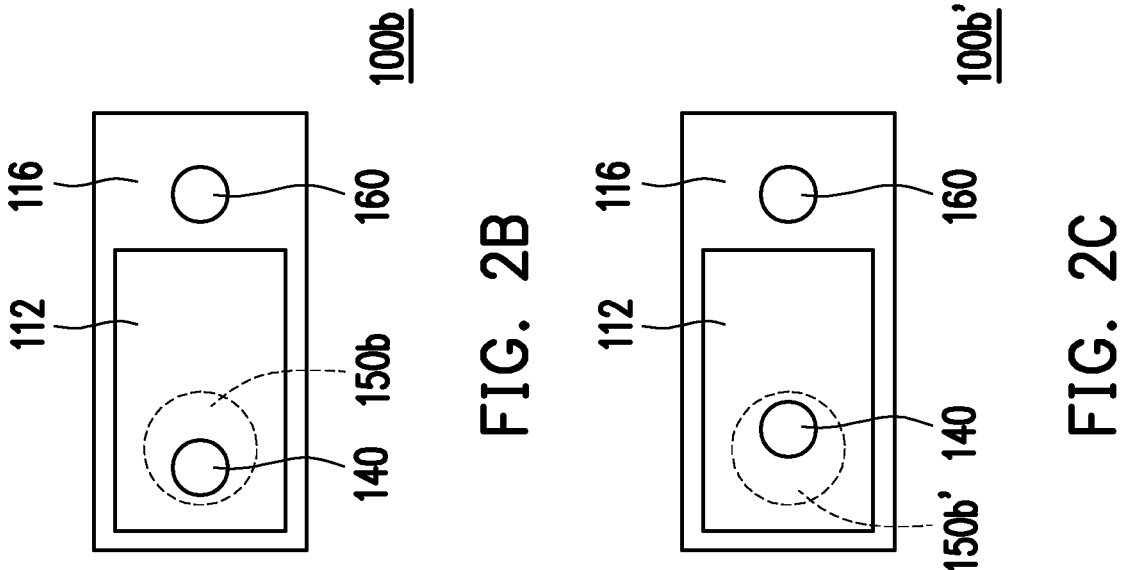
FIG. 2B is a top schematic diagram of the micro light-emitting device in FIG. 2A.
FIG. 2C is a top schematic diagram of a micro light-emitting device according to another embodiment of the disclosure.

FIG. 2A is a cross-sectional schematic diagram of a micro light-emitting device according to another embodiment of the disclosure. FIG. 2B is a top schematic diagram of the micro light-emitting device in FIG. 2A. For convenience of description, some components are omitted in FIG. 2B. Referring to FIG. 1A, FIG. 1B, FIG. 2A, and FIG. 2B at the same time, the micro light-emitting device 100b of this embodiment is similar to the micro light-emitting device 100a, the difference between the two lies in: in this embodiment, the diffusion structure 150b of the micro light-emitting device 100b is shifted inward toward the second electrode 130, which means that the horizontal distance between the diffusion structure 150b and the second electrode 130 is less than the horizontal distance between the first contact layer 140 and the second electrode 130. In addition to the early diffusion of carriers, which has a better effect of lateral current diffusion, a relatively large area of the active layer 114 is further reserved in the outer region. Therefore, the outer region of the active layer 114 originally with a lower carrier density may provide more carriers for recombination, further improving the internal quantum efficiency.

FIG. 2C is a top schematic diagram of a micro light-emitting device according to another embodiment of the disclosure. For convenience of illustration, some components are omitted in FIG. 2C. Referring to FIG. 2B and FIG. 2C at the same time, the micro light-emitting device 100b' of this embodiment is similar to the micro light-emitting device 100b, the difference between the two lies in: in this embodiment, the diffusion structure 150b' of the micro light-emitting device 100b' is shifted outward in a direction away from the second electrode 130 (refer to FIG. 2A).

Figure 3A:
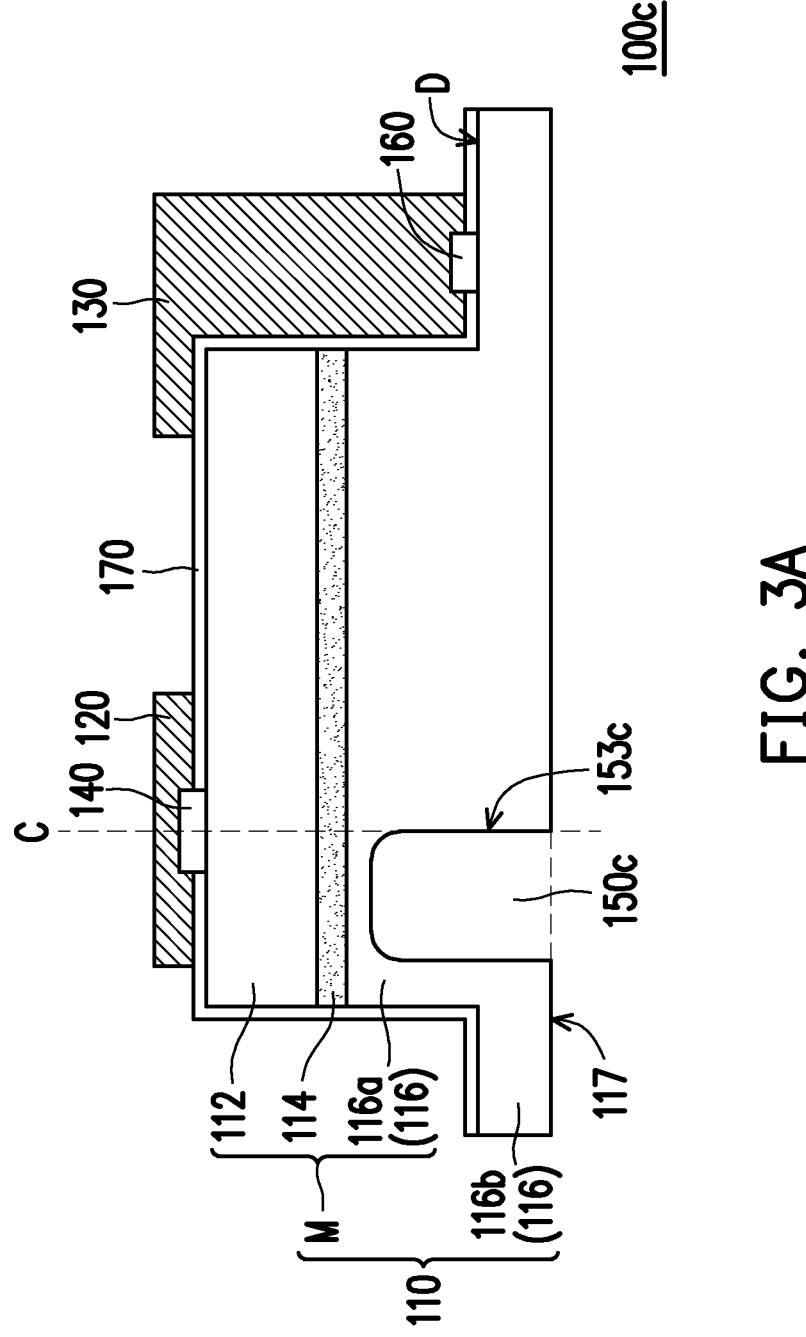
FIG. 3A is a cross-sectional schematic diagram of a micro light-emitting device according to another embodiment of the disclosure.
Figure 3B:
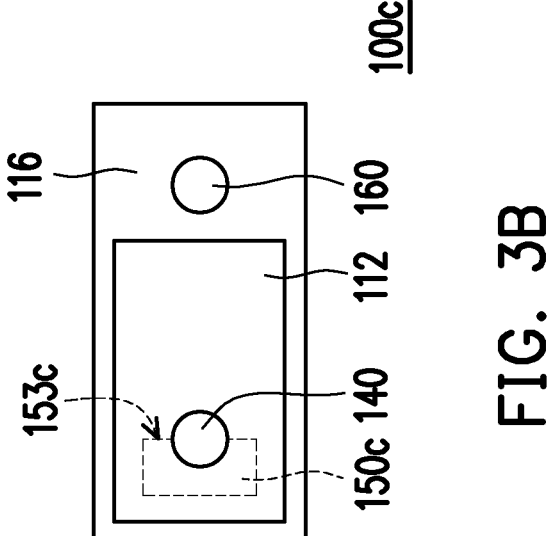
FIG. 3B is a top schematic diagram of the micro light-emitting device in FIG. 3A.

FIG. 3A is a cross-sectional schematic diagram of a micro light-emitting device according to another embodiment of the disclosure. FIG. 3B is a top schematic diagram of the micro light-emitting device in FIG. 3A. For convenience of description, some components are omitted in FIG. 3B. Referring to FIG. 1A, FIG. 1B, FIG. 3A, and FIG. 3B at the same time, the micro light-emitting device 100c of this embodiment is similar to the micro light-emitting device 100a, the difference between the two lies in: in this embodiment, the center of the diffusion structure 150c of the micro light-emitting device 100c is misaligned with the first contact layer 140, that is, the diffusion structure 150c is shifted outward away from the second electrode 130, so that the orthographic projection of the diffusion structure 150c on the active layer 114 partially overlaps the orthographic projection of the first contact layer 140 on the active layer 114. At this time, the inner surface 153c of the diffusion structure 150c is, for example, aligned with the centerline C of the first contact layer 140, and the horizontal distance between the diffusion structure 150c and the second electrode 130 is greater than the horizontal distance between the first contact layer 140 and the second electrode 130.

Figure 4A:
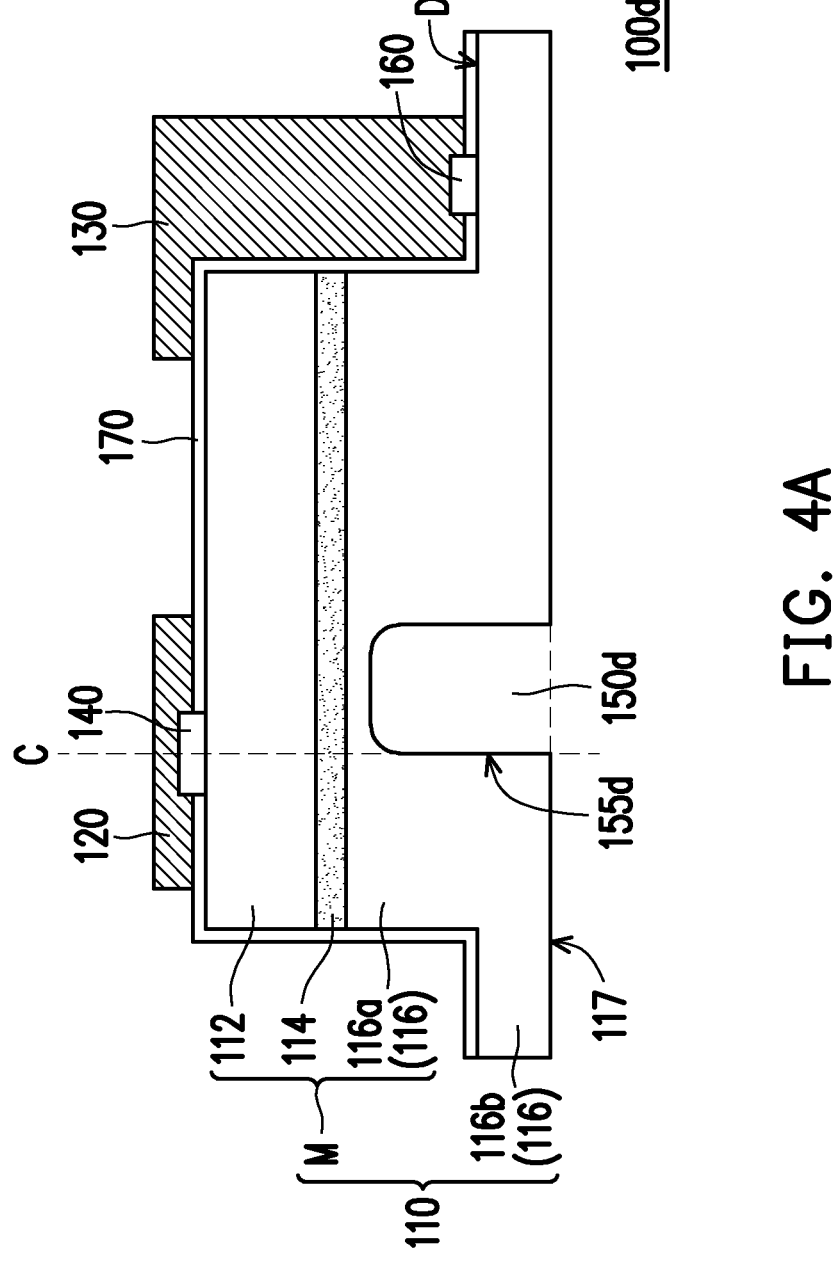
FIG. 4A is a cross-sectional schematic diagram of a micro light-emitting device according to another embodiment of the disclosure.
Figure 4B:
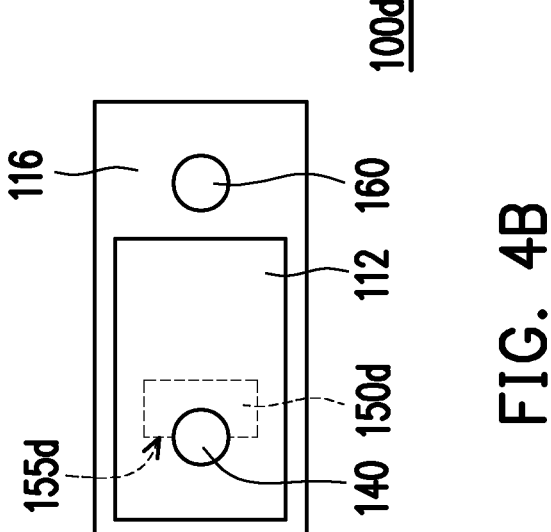
FIG. 4B is a top schematic diagram of the micro light-emitting device in FIG. 4A.

FIG. 4A is a cross-sectional schematic diagram of a micro light-emitting device according to another embodiment of the disclosure. FIG. 4B is a top schematic diagram of the micro light-emitting device in FIG. 4A. For convenience of description, some components are omitted in FIG. 4B. Referring to FIG. 1A, FIG. 1B, FIG. 4A, and FIG. 4B at the same time, the micro light-emitting device 100d of this embodiment is similar to the micro light-emitting device 100a, the difference between the two lies in: in this embodiment, the center of the diffusion structure 150d of the micro light-emitting device 100d is misaligned with the first contact layer 140, that is, the diffusion structure 150d is shifted inward toward the second electrode 130, so that the orthographic projection of the diffusion structure 150d on the active layer 114 partially overlaps the orthographic projection of the first contact layer 140 on the active layer 114. At this time, the outer surface 155d of the diffusion structure 150d is, for example, aligned with the centerline C of the first contact layer 140, and the horizontal distance between the diffusion structure 150d and the second electrode 130 is less than the horizontal distance between the first contact layer 140 and the second electrode 130.

Figure 5:
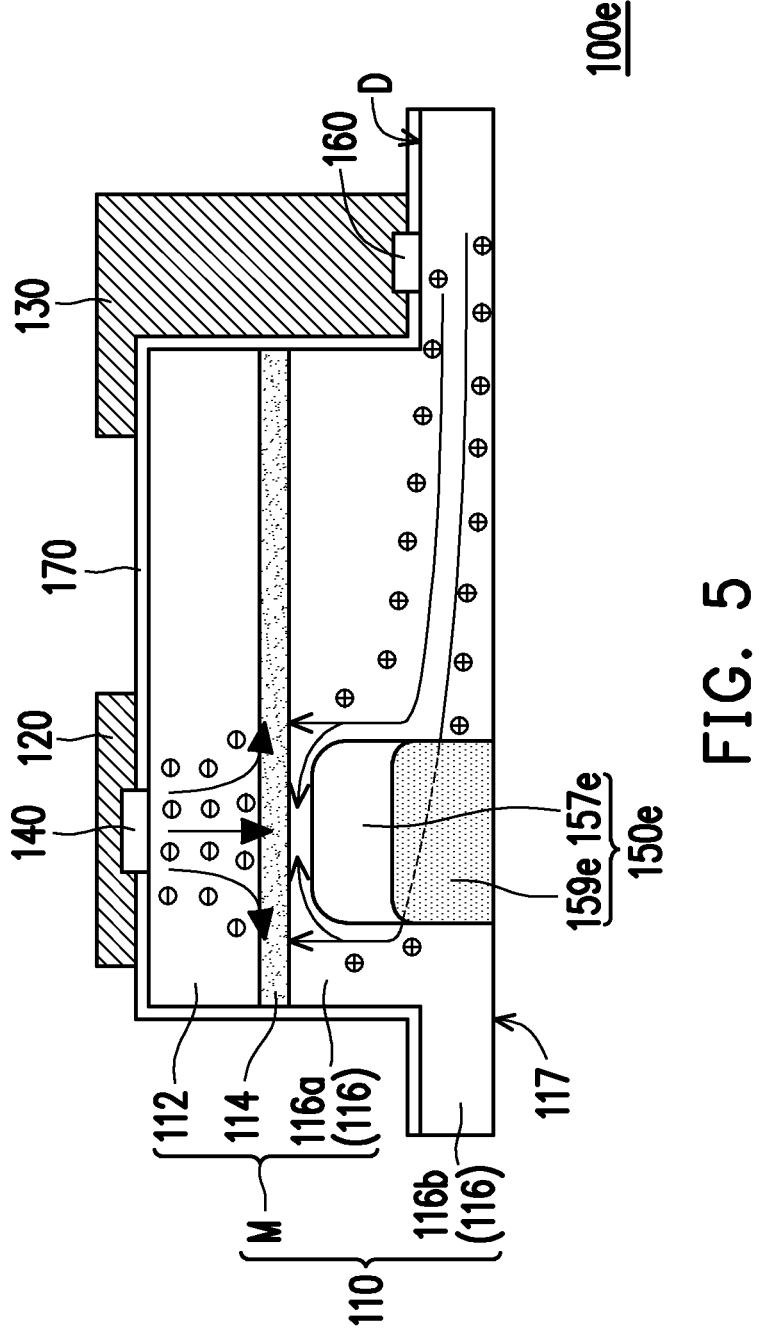
FIG. 5 is a cross-sectional schematic diagram of a micro light-emitting device according to another embodiment of the disclosure.

FIG. 5 is a cross-sectional schematic diagram of a micro light-emitting device according to another embodiment of the disclosure. Referring to FIG. 1A and FIG. 5 at the same time, the micro light-emitting device 100e of this embodiment is similar to the micro light-emitting device 100a, the difference between the two lies in: in this embodiment, the diffusion structure 150e of the micro light-emitting device 100e includes a first diffusion structure 157e and a second diffusion structure 159e, in which the first diffusion structure 157e is located between the second diffusion structure 159e and the active layer 114. Here, the material of the first diffusion structure 157e is different from the material of the second diffusion structure 159e. In some embodiments, the conductivity of the material of the first diffusion structure 157e is lower than the conductivity of the material of the second diffusion structure 159e, so as to enhance a larger current diffusing effect in a region closer to the active layer 114. In one embodiment, the material of the first diffusion structure 157e is, for example, air, and the material of the second diffusion structure 159e is, for example, an inorganic material, an organic material or a combination of the above materials. In another embodiment, the material of the first diffusion structure 157e and the material of the second diffusion structure 159e are respectively air, inorganic material, organic material, or a combination of two of the above materials.

Figure 6:
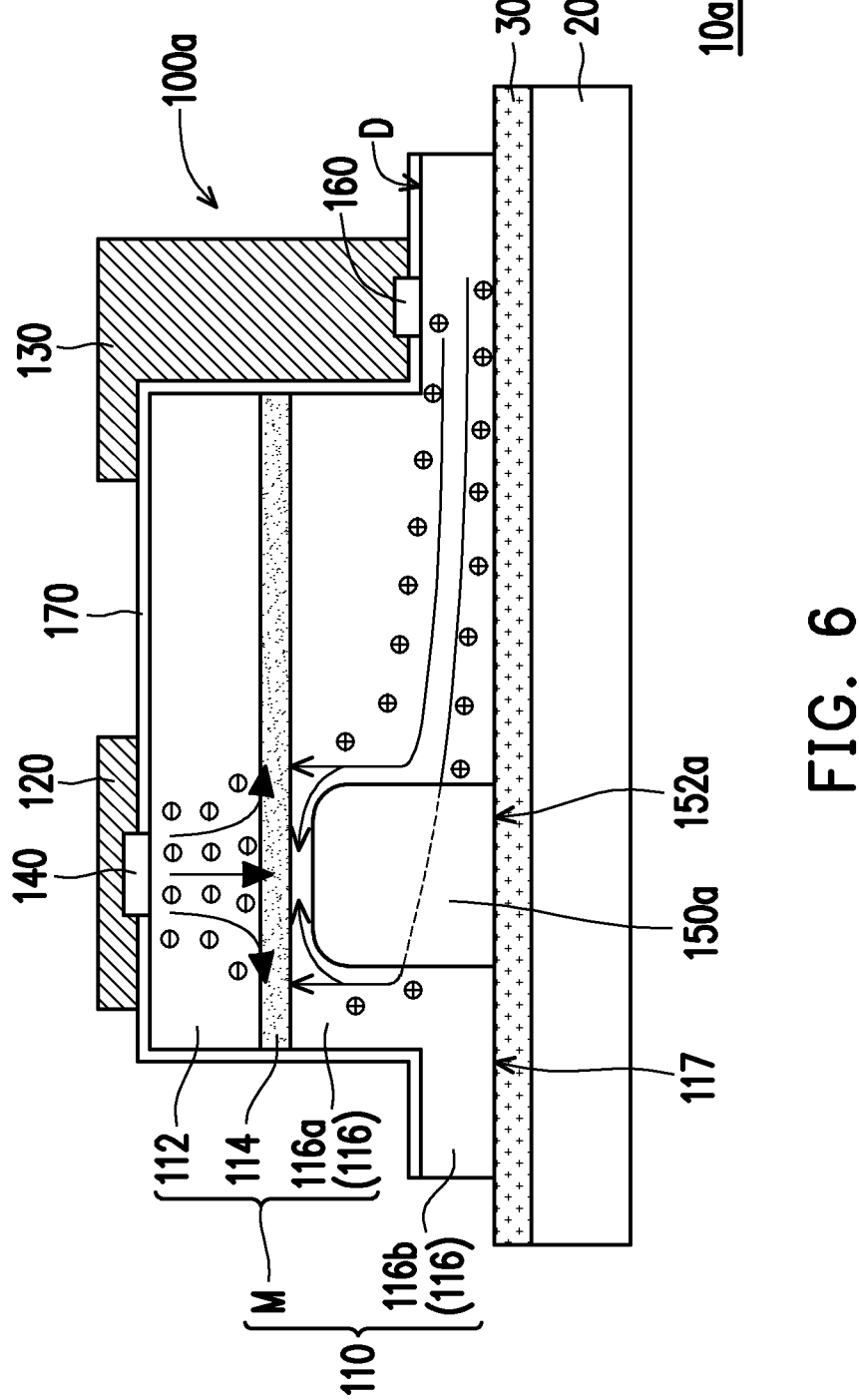
FIG. 6 is a cross-sectional schematic diagram of a micro light-emitting device structure according to an embodiment of the disclosure.

FIG. 6 is a cross-sectional schematic diagram of a micro light-emitting device structure according to an embodiment of the disclosure. Referring to FIG. 6, in this embodiment, the micro light-emitting device structure 10a includes a substrate 20 and a micro light-emitting device 100a shown in FIG. 1A, in which the micro light-emitting device 100a is disposed on the substrate 20. Here, the micro light-emitting device structure 10a further includes a die bonding adhesive layer 30 disposed on the substrate 2. The lower surface 152a of the diffusion structure 150a of the micro light-emitting device 100a and the outer surface 117 of the second-type semiconductor layer 116 directly contact the die bonding adhesive layer 30, and the micro light-emitting device 100a is fixed on the substrate 20 through the die bonding adhesive layer 30.

Figure 7:
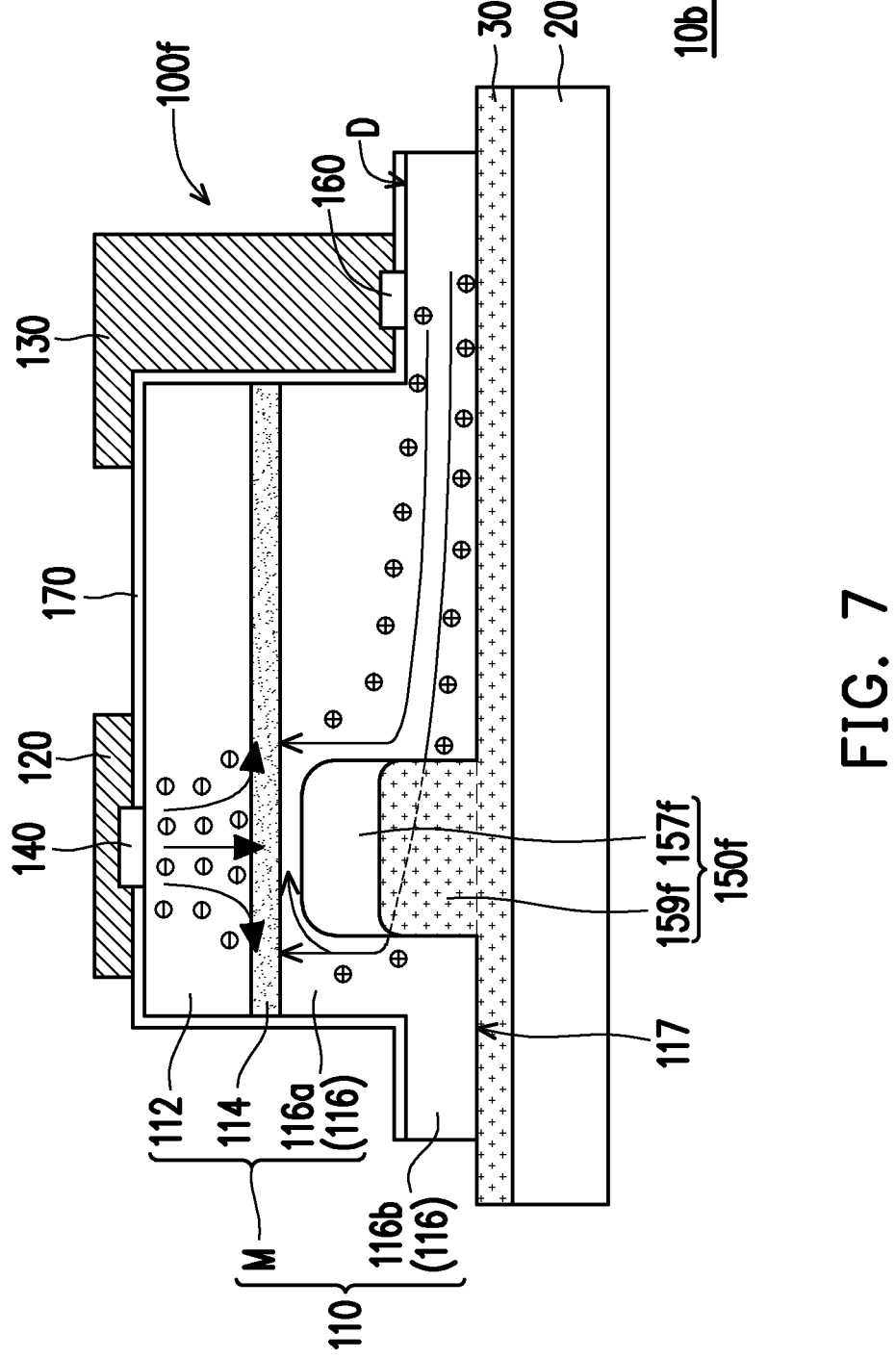
FIG. 7 is a cross-sectional schematic diagram of a micro light-emitting device structure according to another embodiment of the disclosure.

FIG. 7 is a cross-sectional schematic diagram of a micro light-emitting device structure according to another embodiment of the disclosure. Referring to FIG. 6 and FIG. 7 at the same time, the micro light-emitting device structure 10b of this embodiment is similar to the micro light-emitting device structure 10a, the difference between the two lies in: in this embodiment, the diffusion structure 150f of the micro light-emitting device 100f includes a first diffusion structure 157f and a second diffusion structure 159f, in which the second diffusion structure 159f is located between the first diffusion structure 157f and the die bonding adhesive layer 30. Here, the material of the first diffusion structure 157f is different from the material of the second diffusion structure 159f. In one embodiment, the material of the first diffusion structure 157f is air, and the material of the second diffusion structure 159f is the same as the material of the die bonding adhesive layer 30. The second diffusion structure 159f may be formed by filling with the die bonding adhesive when bonding the micro light-emitting device 100f and the substrate 20. In some embodiments, the Young's modulus of the material of the first diffusion structure 157f is greater than the Young's modulus of the material of the second diffusion structure 159f, the internal mechanical strength of the micro light emitting device 100f is relatively high, and at the same time, a cushioning effect may be provided at the connection between the micro light-emitting device 100f and the substrate 20. In one embodiment, the material of the first diffusion structure 157f is inorganic material, organic material, or a combination of two of the above materials, and the material of the second diffusion structure 159f is the same as the material of the die bonding adhesive layer 30. In another embodiment, the material of the diffusion structure 150f may be completely the same as the material of the die bonding adhesive layer 30, that is, there is no air.

Figure 8:
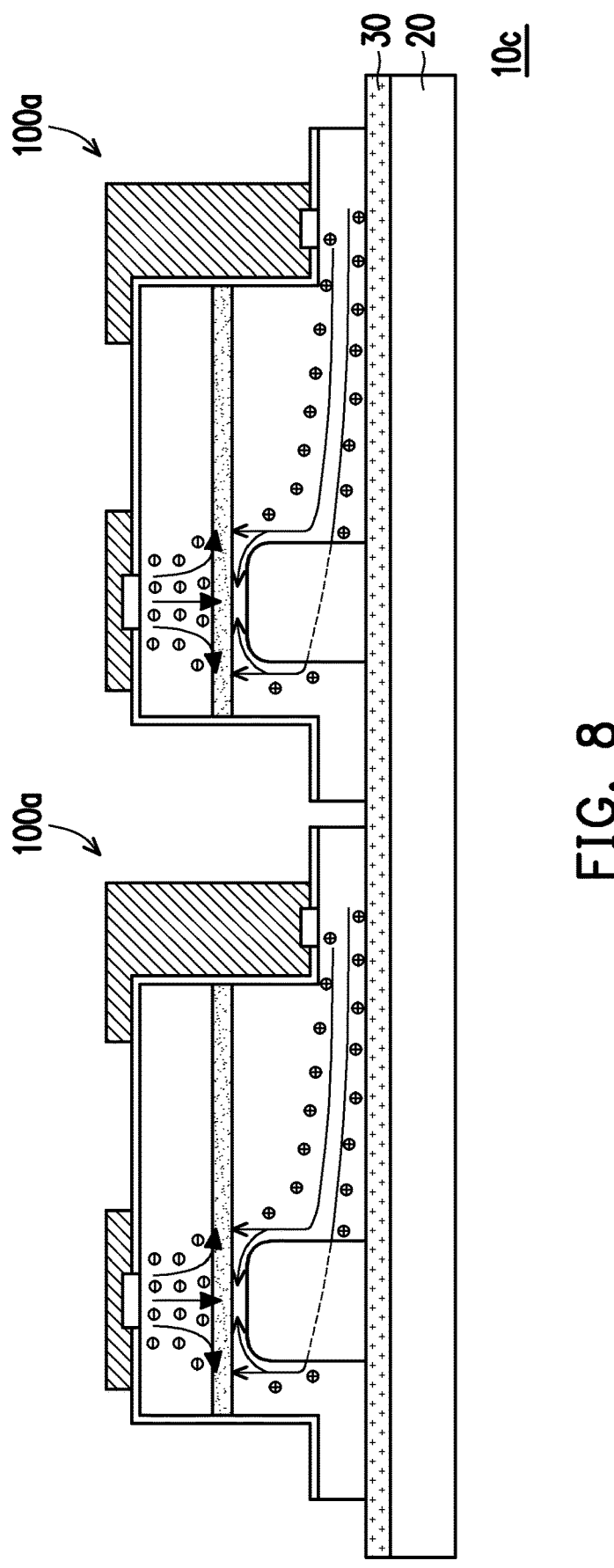
FIG. 8 is a cross-sectional schematic diagram of a micro light-emitting device structure according to another embodiment of the disclosure.

FIG. 8 is a cross-sectional schematic diagram of a micro light-emitting device structure according to another embodiment of the disclosure. Referring to FIG. 6 and FIG. 8 at the same time, the micro light-emitting device structure 10c of this embodiment is similar to the micro light-emitting device structure 10a, the difference between the two lies in: in this embodiment, multiple micro light-emitting devices 100a are separately disposed on the substrate 20.

Figure 9:
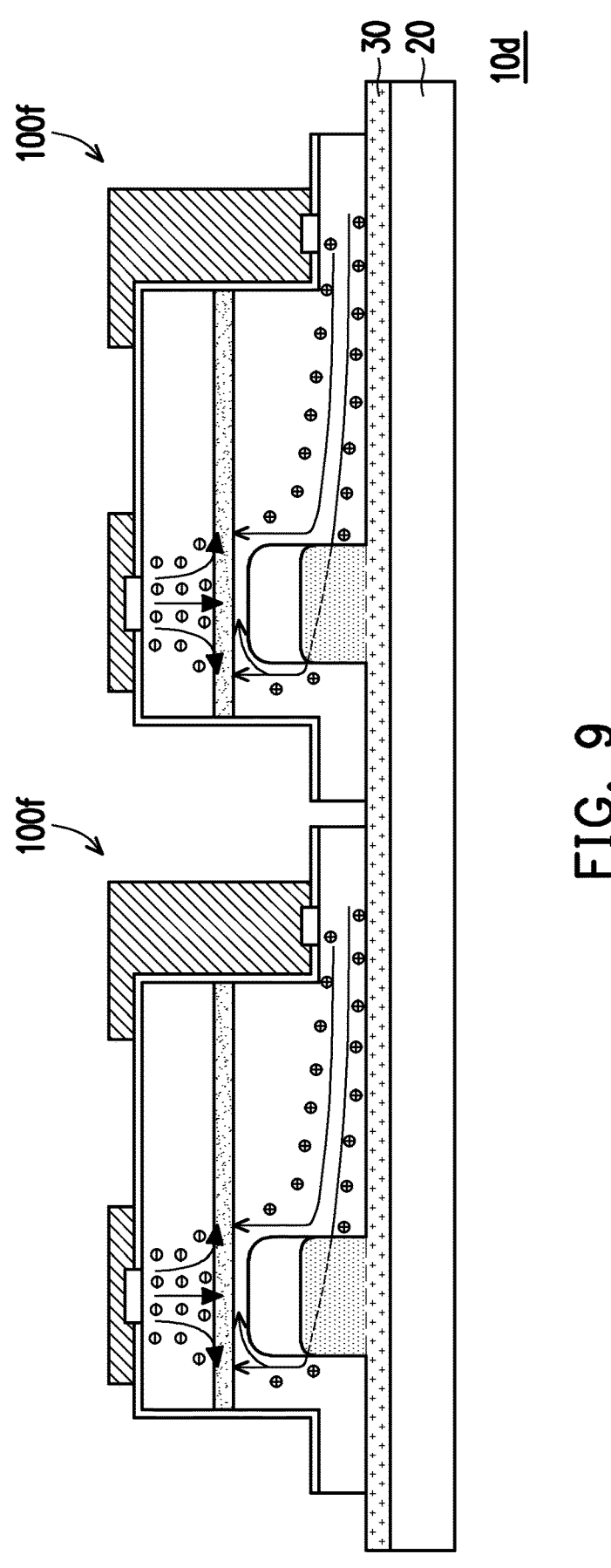
FIG. 9 is a cross-sectional schematic diagram of a micro light-emitting device structure according to another embodiment of the disclosure.

FIG. 9 is a cross-sectional schematic diagram of a micro light-emitting device structure according to another embodiment of the disclosure. Referring to FIG. 7 and FIG. 9 at the same time, the micro light-emitting device structure 10d of this embodiment is similar to the micro light-emitting device structure 10b, the difference between the two lies in: in this embodiment, multiple micro light-emitting devices 100f are separately disposed on the substrate 20.

To sum up, in the design of the micro light-emitting device of the disclosure, the diffusion structure is disposed on a side of the second-type semiconductor layer away from the first-type semiconductor layer. The conductivity of the diffusion structure is lower than the conductivity of the second-type semiconductor layer, and the outer surface of the second-type semiconductor layer exposes a lower surface of the diffusion structure away from the first-type semiconductor layer. The design of the diffusion structure may effectively block the direct flow of carriers to the original recombination region, forcing the current to diffuse to a larger range, thereby increasing the uniformity of the current density and improving the internal quantum efficiency.

Although the disclosure has been described in detail with reference to the above embodiments, they are not intended to limit the disclosure. Those skilled in the art should understand that it is possible to make changes and modifications without departing from the spirit and scope of the disclosure. Therefore, the protection scope of the disclosure shall be defined by the following claims.

What is claimed is:

1. A micro light-emitting device, comprising:

an epitaxial structure, comprising a first-type semiconductor layer, an active layer, and a second-type semiconductor layer stacked in sequence, wherein the second-type semiconductor layer has an outer surface relatively away from the first-type semiconductor layer;

a first electrode, disposed on the epitaxial structure and electrically connected to the first-type semiconductor layer;

a second electrode, disposed on the epitaxial structure and electrically connected to the second-type semiconductor layer;

a first contact layer, disposed between the first electrode and the first-type semiconductor layer; and a diffusion structure, disposed on a side of the second-type semiconductor layer away from the first-type semiconductor layer, wherein a conductivity of the diffusion structure is less than a conductivity of the second-type semiconductor layer, and the outer surface of the second-type semiconductor layer exposes a lower surface of the diffusion structure away from the first-type semiconductor layer, and a material of the diffusion structure at least comprises air.

2. The micro light-emitting device according to claim 1, wherein there is a gap between an upper surface of the diffusion structure opposite to the lower surface and the active layer.

3. The micro light-emitting device according to claim 1, wherein a first thickness of the diffusion structure is greater than half of a second thickness of the second-type semiconductor layer.

4. The micro light-emitting device according to claim 1, wherein an orthographic projection of the first contact layer on the active layer overlaps an orthographic projection of the diffusion structure on the active layer.

5. The micro light-emitting device according to claim 4, wherein an area of the orthographic projection of the diffusion structure on the active layer is greater than an area of the orthographic projection of the first contact layer on the active layer.

6. The micro light-emitting device according to claim 1, further comprising:

a second contact layer, disposed between the second electrode and the second-type semiconductor layer, there is a third thickness between the second contact layer and the outer surface.

7. The micro light-emitting device according to claim 6, wherein the first-type semiconductor layer, the active layer, and a first portion of the second-type semiconductor layer form a platform, a second portion of the second-type semiconductor layer is recessed relative to the platform to form a platform surface, and the second contact layer is located on the platform surface.

8. The micro light-emitting device according to claim 7, wherein a first thickness of the diffusion structure is greater than the third thickness.

9. The micro light-emitting device according to claim 1, wherein the material of the diffusion structure further comprises organic material, inorganic material, or a combination thereof.

10. A micro light-emitting device structure, comprising:

a substrate;

a plurality of micro light-emitting devices, separately disposed on the substrate, wherein each of the micro light-emitting devices comprises:

an epitaxial structure, comprising a first-type semiconductor layer, an active layer, and a second-type semiconductor layer stacked in sequence, wherein the second-type semiconductor layer has an outer surface relatively away from the first-type semiconductor layer;

a first electrode, disposed on the epitaxial structure and electrically connected to the first-type semiconductor layer;

a second electrode, disposed on the epitaxial structure and electrically connected to the second-type semiconductor layer;

a first contact layer, disposed between the first electrode and the first-type semiconductor layer; and a diffusion structure, disposed on a side of the second-type semiconductor layer away from the first-type semiconductor layer, wherein a conductivity of the diffusion structure is less than a conductivity of the second-type semiconductor layer, and the outer surface of the second-type semiconductor layer exposes a lower surface of the diffusion structure away from the first-type semiconductor layer, and a material of the diffusion structure at least comprises air.

11. The micro light-emitting device structure according to claim 10, further comprising:

a die bonding adhesive layer, disposed on the substrate, the lower surface of the diffusion structure of each of the micro light-emitting device and the outer surface of the second-type semiconductor layer directly contact the die bonding adhesive layer, and each of the micro light-emitting device is fixed on the substrate through the die bonding adhesive layer.

12. The micro light-emitting device structure according to claim 11, wherein the diffusion structure comprises a first diffusion structure and a second diffusion structure, the second diffusion structure is located between the first diffusion structure and the die bonding adhesive layer, a material of the first diffusion structure is different from a material of the second diffusion structure.

13. The micro light-emitting device structure according to claim 12, the material of the second diffusion structure is the same as a material of the die bonding adhesive layer.

* * * * *